United States Patent [19]

Stoll

[11] Patent Number: 4,784,715

[45] Date of Patent: Nov. 15, 1988

[54] METHODS AND APPARATUS FOR PRODUCING COHERENT OR MONOLITHIC ELEMENTS

[76] Inventor: Milton Stoll, 36 Mascolo Rd., South Windsor, Conn. 06074

[21] Appl. No.: 145,649

[22] Filed: Jan. 13, 1988

Related U.S. Application Data

[60] Continuation of Ser. No. 898,136, Aug. 19, 1986, abandoned, which is a division of Ser. No. 564,773, Dec. 27, 1983, Pat. No. 4,650,540, which is a continuation of Ser. No. 594,257, Jul. 9, 1975, abandoned, which is a continuation-in-part of Ser. No. 614,728, Feb. 8, 1967, abandoned.

[51] Int. Cl.$^4$ ............... C30B 15/14; C30B 15/22
[52] U.S. Cl. ............... 156/618.1; 156/620.75; 156/619.1; 156/620.74; 422/245
[58] Field of Search ............ 156/618, 617 SP, 617 R, 156/617 M, 608; 422/245, 248, 249

[56] References Cited

U.S. PATENT DOCUMENTS

| | | | |
|---|---|---|---|
| 2,852,420 | 9/1958 | Pohl | 156/617 SP |
| 2,879,189 | 3/1959 | Shockley | 422/249 |
| 3,002,320 | 10/1961 | Theuerer | 156/608 |
| 3,036,892 | 5/1962 | Siebertz | 156/609 |
| 3,124,489 | 3/1964 | Vogel, Jr. et al. | 156/608 |
| 3,296,036 | 1/1967 | Keller | 156/617 M |
| 3,342,559 | 9/1967 | Dermatis | 156/617 SP |
| 3,351,433 | 11/1967 | Keller | 156/617 SP |
| 3,353,914 | 11/1967 | Pickar, Jr. | 156/617 SP |
| 3,360,405 | 12/1967 | Keller | 156/617 M |

Primary Examiner—Gary P. Straub
Attorney, Agent, or Firm—Fishman, Dionne & Cantor

[57] ABSTRACT

Methods and apparatus for producing coherent or monolithic elements, such as mono-crystalline semiconductor rods, preferably by growing or drawing one or more such elements upwardly from an off-center portion of a molten pool in the top of a cake of material while rotating the cake and/or rod or rods, for example, in the same direction and at the same rate; heat balancing the element as it is grown from the pool and maintaining the rod-pool location positioned relative to heating means, as by adding additional materials to the pool as the element is withdrawn; and/or providing relative feeding movement between the cake and rod; and providing a chilled mold beneath the cake.

18 Claims, 3 Drawing Sheets

METHODS AND APPARATUS FOR PRODUCING COHERENT OR MONOLITHIC ELEMENTS

REFERENCE TO RELATED APPLICATION

This is a continuation of co-pending application Ser. No. 898,136 filed on Aug. 19, 1986, abandoned, which was a divisional of Application Ser. No. 564,773 filed Dec. 27, 1983, Now U.S. Pat. No. 4,650,540 which, in turn, was a continuation of Application Ser. No. 594,257 filed July 9, 1975, now abandoned, which, in turn, was a continuation-in-part of Application Ser. No. 614,728 filed Feb. 8, 1967, now abandoned.

BACKGROUND AND SUMMARY OF THE INVENTION

This invention relates to methods and apparatus for producing coherent or monolithic elements, such as rods of amorphous or monocrystalline material, and, more particularly, to methods of growing such elements which are characterized by high purity and freedom from dislocations and discontinuities.

The most important present commercial utilization of the present invention is in the production of semi-conductor materials, such as are extensively utilized in the electronics industry, but it is to be understood at the outset that the present invention may be utilized for the production of other than semi-conductor crystals or materials, such as crystalline materials in the nature of rubies for laser applications, grainless metals, amorphous materials, and the like. For purposes of illustrating the present invention, however, the material produced will be assumed to be monocrystalline semi-conductor materials having uniform physical and chemical properties.

The production of crystals having exceedingly high purity or freedom from dislocations has become increasingly important, especially for the production of semi-conductor material for use in the electronics industry as well as for use in basic research.

Monocrystalline materials, e.g., semi-conductor materials comprising, e.g., silicon or germanium have previously been produced by several basic methods. All of the previously suggested techniques have been based upon variations of two basic crystal growth mechanisms. One such mechanism is the Czochralski technique and the other is that of zone melting. The Czochralski technique, and the various variations thereof, produce monocrystalline structures by pulling a single crystal from a molten mass of raw material contained within a crucible. Zone melting techniques do not use a crucible, but rather melt only a very small region of a polycrystalline bar, as by radio-frequency induction, and depend upon surface tension of the molten zone to retain the molten material relative to the crystalline material.

The crucibles utilized in the Czochralski growth techniques are generally fabricated of a relatively inert material, such as quartz. The presence of even an inert material such as quartz in contact with the molten material invariably produces some oxygen contamination of the melt at the relatively high temperatures necessary. The zone melting techniques, on the other hand, depend upon surface tension of the molten zone to retain the molten material in position and generally produce excessive crystal dislocations, strains or discontinuities because of the large temperature differentials inherently present in such a thin molten zone.

Accordingly, it is a primary object of the present invention to produce monolithic structures or elements which are of high purity, coherent, and dislocation or discontinuity-free, and possessing uniform physical, chemical and electrical properties.

Another primary object of the present invention, in addition to the foregoing object, is to produce high purity monocrystalline structures which are relatively dislocation-free.

Another primary object of the present invention, in addition to the foregoing objects, is to produce monocrystalline structures of high purity.

Another primary object of the present invention, in addition to each of the foregoing objects, is to produce such structures of larger diameter than heretofore capable of production.

Another primary object of the present invention, in addition to each of the foregoing objects, is to produce such structures by controlled accretion from a molten mass.

Yet another primary object of the present invention, in addition to the foregoing objects, is to provide methods and apparatus for producing such structures continuously, rather than by batch techniques.

A still further primary object of the present invention, in addition to the foregoing objects, is to provide methods and apparatus for producing such structures which enable finely controlled doping thereof to be easily and readily accomplished.

A still further primary object of the present invention, in addition to each of the foregoing objects, is to provide such methods and apparatus producing a generally uniform physical and chemical property profile across the growing structure-melt interface.

Another and yet still further primary object of the present invention, in addition to the foregoing objects, is to provide such methods and apparatus which enable relatively uniform relative movement between the growing structure and the melt.

Another and yet still further primary object of the present invention, in addition to the foregoing objects, is to provide such methods and apparatus which precludes contamination of the structure material.

It is also a primary object of the present invention, in addition to the foregoing objects, to provide such methods and apparatus having a minimum complexity and a maximum ease of operation.

It is a feature of the present invention that the structure production may be terminated at any desired time and the melt allowed to solidify, without damage or loss of materials.

The invention resides in the combination, construction, arrangement and disposition of the various component parts and elements incorporated in improved methods and apparatus for element growing in accordance with the principles of this invention. The present invention will be better understood and objects and important features other than those specifically enumerated above will become apparaent when consideration is given to the following details and description, which when taken in conjunction with the annexed drawing describes, discloses, illustrates and shows certain preferred embodiments or modifications of the present invention and what is presently considered and believed to be the best mode of practicing the principles thereof. Other embodiments or modifications may be suggested to those having the benefit of the teaching herein, and such other embodiments or modifications are intended to be reserved especially as they fall within the scope and spirit of the subjoined claims.

IN THE DRAWINGS

DESCRIPTION OF THE PREFERRED EMBODIMENTS

Figure 1:
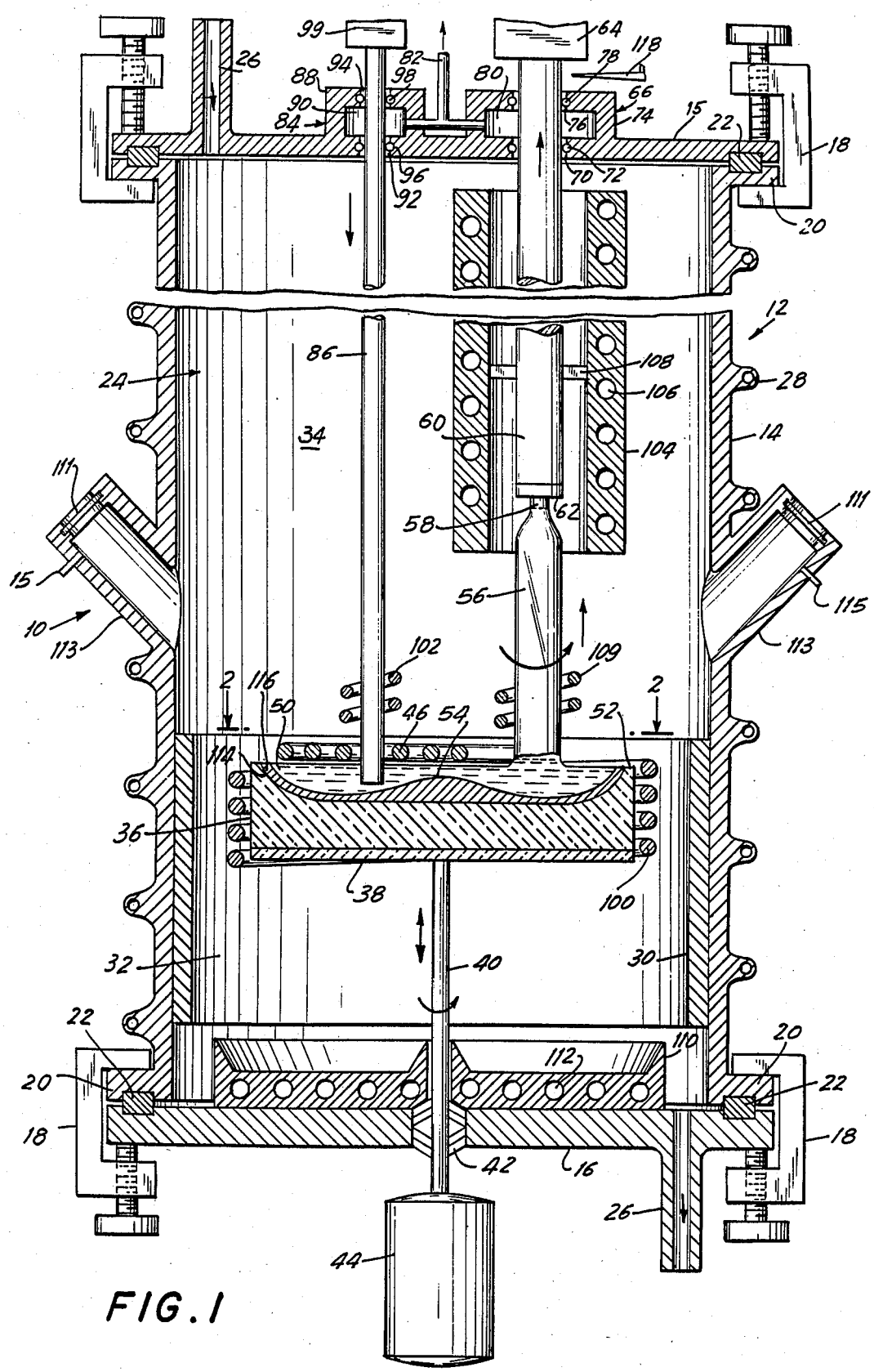
FIG. 1 is a cross-sectional elevational view of monolithic structure growing apparatus constructed in accordance with the principles of the present invention.
Figure 2:
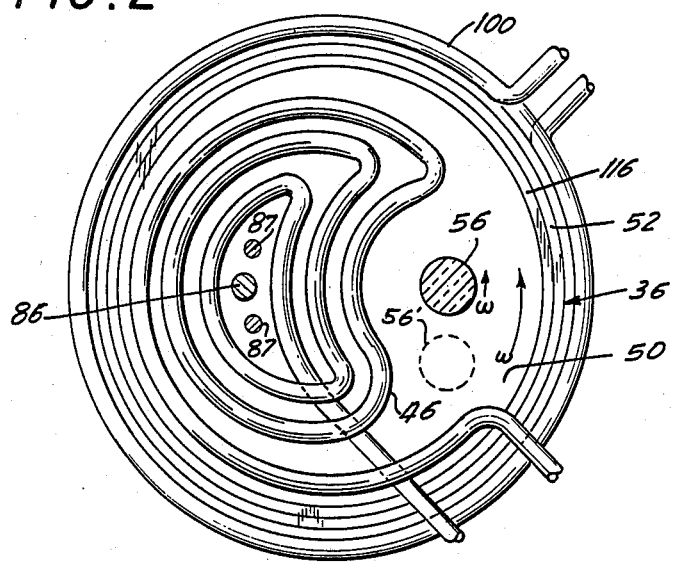
FIG. 2 is a plan view taken along line 2—2 of FIG. 1.

With reference now to the drawing, and particularly to FIGS. 1 and 2 thereof, there is shown and illustrated a preferred form of apparatus for producing monolithic or coherent structures or elements, such as monocrystalline rods designated generally by the reference character 10, which is constructed in accordance with the principles of the present invention.

The apparatus 10 comprises a furnace enclosure 12 adapted to contain herewithin an inert atmosphere or a vacuum, in accordance with conventional practice. The furnace enclosure 12 may, for example, comprise a cylinder 14, a cap 15 and a base 16 adapted to be secured removably together by means, such as a plurality of clamps 18. The cylinder 14 is provided with means, such as generally radially extending shoulders 20 adapted to be engaged by the clamps 18 and sealing means, such as annular seals 22, is adapted to be clamped between the shoulders 20, the lower surface of the cap 15 and the upper surface of the base 16, respectively, to provide within the furnace enclosure 12 a sealed chamber 24. Conduit means, such as passages 26, is provided for enabling evacuation or atmospheric control of the chamber 24.

The furnace enclosure 12 is provided with cooling means, such as a cooling coil 28, adapted to enable circulation therethrough of a cooling medium, such as water, in contiguous relationship to the furnace enclosure 12. The lower portion of the cylinder 14 is provided on the interior surface thereof with insulation means, such as an annular layer of insulation 30 so that the chamber 24 will be thereby subdivided into a heating portion 32 and a cooling portion 34. Rather than a conventional insulation, the insulation 30 may also comprise a radiation shield or the like, since at the temperatures involved, most of the energy is in the form of radiation, and furthermore, when working under evacuated or vacuum conditions, radiation shielding or reflecting means are all that is required to provide the desired insulation. A cake of material 36, which may be polycrystalline, is rotatably supported within the heating portion 32 of the chamber 24, as on a support platform or disk 38 fabricated of a relatively rigid material which is structurally associated with a shaft 40 extending generally centrally through the base 16 whereat the shaft 40 is rotatably supported by sealing bearing means, illustrated schematically as stacked chevrons 42. A drive 44, which preferably is capable of providing both rotational and vertical or axial movement of the shaft 40, is structurally associated at the lower end of the shaft 40 to at least rotatably drive the shaft 40, disk 38 and cake of material 36 and, preferably, to enable advancement and/or axial positioning thereof.

Primary heating means, such as a resistance heating element or a radio-frequency induction heating element 46, is provided positioned adjacent the upper surface of the cake 36 to provide a pool 50 of molten material within the top surface of the cake 36. The primary heating means 46 is so constituted and arranged as to provide the pool of molten material 50 in such a manner as to enable the pool 50 to be contained by the cake 36, that is, to enable an edge wall 52 of generally annular configuration to remain in the solid state. Hence, the pool of molten material 50 contacts only the cake 36, and, of course, the atmosphere within the chamber 24. Hence, contamination of the pool of molten material 50 from contact with a crucible, or the like, is entirely precluded in the present apparatus. Moreover, the annular edge wall 52 enables the pool of molten material 50 to be of a substantial depth, so that the temperature profile thereof adjacent the surface may be substantially constant. Since the pool of molten material 50 is contained by the cake 36, rather than by means of a separate crucible, as in conventional Czochralski apparatus, or by surface tension as in conventional float zone apparatus, the depth of the pool of molten material 50 may be substantial while precluding loss of molten material from the pool or contact by the molten material with contaminants, such as an external crucible.

The configuration and power input to the heating means 46 may be so selected as to configure the pool of molten material 50 to generally annular configuration, as shown, or may be sufficient to melt a sufficient amount of material to form the pool of molten material 50 across the center of the cake 36, as shown by the line 54.

A rod of monocrystalline material 56 may be pulled or grown upwardly from the melt or pool of molten material 50 as is well known in the art. However, rathan than being pulled from a location generally central of the melt or pool of molten material 50, the rod of monocrystalline material 56 is preferably pulled from an off-center location, as shown. In accordance with conventional practice, a seed crystal 58 is secured with a pull rod 60, as by means of a chuck 62 fabricated of molybdenum, or the like. The pull rod 60 is rotated by means, not shown, and slowly moved axially upwardly from the melt or pool of molten material 50 as by feed means 64.

The pull rod 60 preferably passed upwardly through a main port 66 provided in the cap 15, with the feed means 64 being disposed outwardly of the furnace enclosure 12, as shown. The feed means 64 is shown diagrammatically in simplified form as clearly comprising a plurality of feed wheels, or the like, but in actual practice, since the rate of pull must be exceedingly slow and at a finely controlled rate, the feed means 64 in actuality preferably comprises a very accurate slow speed drive, such as a worm driven frame, or the like.

The main port 66 comprises an aperture 70 extending through the top wall or cap 15 and provided with sealing means. Preferably, the sealing means 72, which, for simplicity of illustration, is shown as an O-ring seal, comprises a more sophisticated seal, such as stacked chevron seals. The sealing means 72 preferably is also capable of maintaining a sealing relationship with the pull rod 60 and with the rod of monocrystalline material 56, regardless of whether the atmosphere within the furnace enclosure 12 is above or below the external pressure. Moreover, the sealing means 72 should be capable of providing centering support to the pull rod 60 and to the rod of monocrystalline material 56. In conventional or heretofore known apparatus of this general type, the rod of monocrystalline material has been produced by a batch technique, and only the pull rod has been reciprocated through such a seal. The present invention, as herein pointed out, is capable of continuous production of the rod of monocrystalline material 56. Hence, since the rod of monocrystalline material produced is not, generally, or uniform diameter and generally does not comprise a smooth surface, the sealing means 72 is preferably capable of maintaining a proper seal against such an uneven surface. To further aid in providing a proper seal through the cap 15, and to provide additional support to the pull rod 60 and the rod of monocrystalline material 56, which is necessary to prevent a whipping action thereof due to the rotation, the main port 66 may further comprise an auxiliary bell structure 74 provided with an aperture 76 is spaced apart aligned relationship to the aperture 70. The aperture 76, similar to the aperture 70 is provided with sealing means 78 similar in design and function to the sealing means 72. Accordingly, the main port 66 is thereby provided with a buffer chamber 80 adapted to be evacuated or pressurized in accordance with the conditions existing within the chamber 34, as by means of conduit means 82 to thereby preclude contamination of the chamber 34. Preferably, the conditions imposed at the buffer chamber 80 are such as to provide a small inert gas flow past the sealing means 72 into the furnace enclosure 12 to preclude any condensation or fouling from occurring at the region of the sealing means 72. Without such small flow, the high temperature present at the pool of molten material 50, and the vapor pressure of the molten material would ordinarily produce a condensation of the material, similar to that occurring in conventional vacuum deposition techniques.

As the rod of material 56 is pulled or grown from the melt or pool of molten material 50, the cake 36 may be advanced or raised to retain the surface of the melt or pool of molten material 50 appropriately spaced from the main heating means 46. However, it is within the ambit of the present invention to enable the continuous production of monocrystalline rod material. Accordingly, the cake 36 need only be initially vertically positioned and auxiliary port means 84 may be provided structurally associated with the top wall or cap 15 of the bell jar 14 to enable continuous introduction of a rod of additional material 86 into the chamber 34 and into the melt or pool of molten material 50, in order to maintain the level of the melt. Furthermore, the auxiliary port means 84 may be utilized to enable the introduction of rods of doping material 87 (see FIG. 2) into the melt or pool of molten material 50. The auxiliary port means 84, similarly to the main port 66 comprises a bell jar structure 88 defining a buffer chamber 90 adjacent the cap 15 of the furnace enclosure 12. The cap 15 of the furnace enclosure 12 and the auxiliary bell jar structure 88 are each provided with axially aligned apertures 92 and 94, respectively, the number thereof being dependent upon the number of rods 86 and 87 to be introduced. The auxiliary port means 84 may further be provided with means to seal off the apertures, if less than the maximum number of rods are to be inserted. The apertures 92 and 94 are each provided with sealing means 96 and 98, respectively, similar to the seals 72 and 78. The buffer chamber 90 is connected with the conduit means 82 to enable evacuation or inert gas pressurization of the buffer chamber 90 to preclude the introduction of contaminants into the main chamber 34. Auxiliary drive means 99, which are shown only schematically, may be provided to feed the conduit means 82 to enable evacuation or inert gas pressurization of the buffer chamber 90 to preclude the introduction of contaminants into the main chamber 34. Auxiliary drive means 99, which are shown only schematically, may be provided to feed the rods 86 and 87. The drive means 99 may be automatically actuated, or may be manually controlled. Furthermore, the dopant may be added to the melt as a constituent of the polycrystalline material which comprises the cake 36 or the rod 86.

Auxiliary cake heating means, such as resistance or radio-frequency induction heating coils 100 are provided adjacent the cake 36 to maintain the temperature of the cake 36 close to but just below the melting temperature of the cake 36. The cake heating means 100 may also comprise a susceptor, or the like, if required for effective heating of the cake 36. Furthermore, auxiliary heating means, such as resistance heating means or radio-frequency induction heating means 102 may be provided to pre-heat the rod of polycrystalline material 86 or the rods of dopant material 87.

The cooling of the rod of monocrystalline material 56 preferably is rigidly controlled. To this end, a cooling sleeve 104 provided with coolant passages 106 is positioned within the furnace enclosure 12 and is so configured and arranged that the rod of monocrystalline material 56 will be drawn therethrough. The cooling sleeve 104 may cool the pull rod 60 and rod of monocrystalline material 56 by convection and radiation or may be constructed and arranged to cool them directly by conduction. The cooling sleeve 104 may further be provided with bearing means 108 to aid in maintaining the pull rod 60 and the rod of monocrystalline material 56 in the correct alignment thereof. The cooling sleeve 104 may be in a fixed position relative to the cake 36 or may be vertically movable so that the distance between the cooling sleeve 104 and the surface of the melt or pool of molten material 50 may be varied to control the cooling rate of the rod of monocrystalline material 56. Supplementary heat control means 109, which preferably, is capable of selectively heating or cooling the rod of monocrystalline material 56 as it is being drawn from the pool of molten material 50 may be provided. The supplementary heat control means 109 may, for example, comprise a coil through which an appropriate heat transfer medium may be circulated. The supplementary heat control means 109, together with the cooling sleeve 104 and main heating means 46 therefore enables the temperature profile across the rod melt interface to be readily controlled.

A chilled mold 110 may be positioned below the cake 36 and provided with cooled passages 112. The chilled mold 110 preferably is fabricated of a material having high heat conductivity, such as copper, or the like. With the chilled mold 110 positioned beneath the cake 36, if the cake 36 is overheated or, for any other reason, molten material from the cake falls thereon, the molten material will immediately solidify by contact with the chilled mold in such a short period of time that contamination of the material will not take place.

Since only a small portion of the cake 36 is utilized to form the melt or pool of molten material, it is not necessary that the entire cake 36 be composed of pure material. The cake 36 may comprise relatively impure material which is previously machined or otherwise provided with a recess 114 therein. A relatively thin layer of pure polycrystalline material 116 may then be cast into the recess 114 to form a buffer layer between the melt or pool of molten material and the remainder of the cake 36. In this way, only a relatively small amount of pure material, which is quite expensive, is required and the predominant portion of the cake 36 may be fabricated or relatively inexpensive material. Furthermore, the remainder of the cake 36 may even comprise a material substantially dissimilar to that of the pool of molten material 50, such as a conventional crucible material. Since the buffer layer 114 precludes contact of the molten material 50 with the remainder of the cake 36, contamination of the melt or pool of molten material is effectively precluded.

Preferably, however, the cake 36 does comprise a material which is substantially similar to the material being drawn, or grown, at least insofar as temperature-density characteristics are concerned. If the cake 36 does comprise a material having similar temperature-density characteristics throughout, then the growing operation may be terminated at any desired time and the melt be permitted to cool and solidify without resulting in any damage. In conventional crucible melting of the material, the molten mass must be entirely removed from the crucible without permitting the melt to solidify within the crucible, since the crucible would be destroyed upon solidification of the melt.

Cut-off means 118, such as an abrasive wheel, or the like, may also be provided to enable the rod of monocrystalline material 56 to be severed as it emerges from the furnace enclosure 12.

As hereinbefore pointed out, both the cake 36 and the rod of monocrystalline material 56 are rotated during the drawing, growing or pulling process. Preferably, the rod of monocrystalline material 56 and the cake of polycrystalline material 36 are rotated in the same direction and at the same rate of rotation. Also, if the rod of monocrystalline material 56 is entirely offset from the axis of rotation of the cake 36, as shown in FIGS. 1 and 2, the relative velocity at the melt-crystal interface will be constant in the tangential direction enabling optimum production of dislocation-free crystals. Furthermore, such arrangement, especially in conjunction with the presence of the cooling sleeve 104 and supplementary heat control means 109, enables an optimum temperature profile at the melt-crystal interface.

Figure 7:
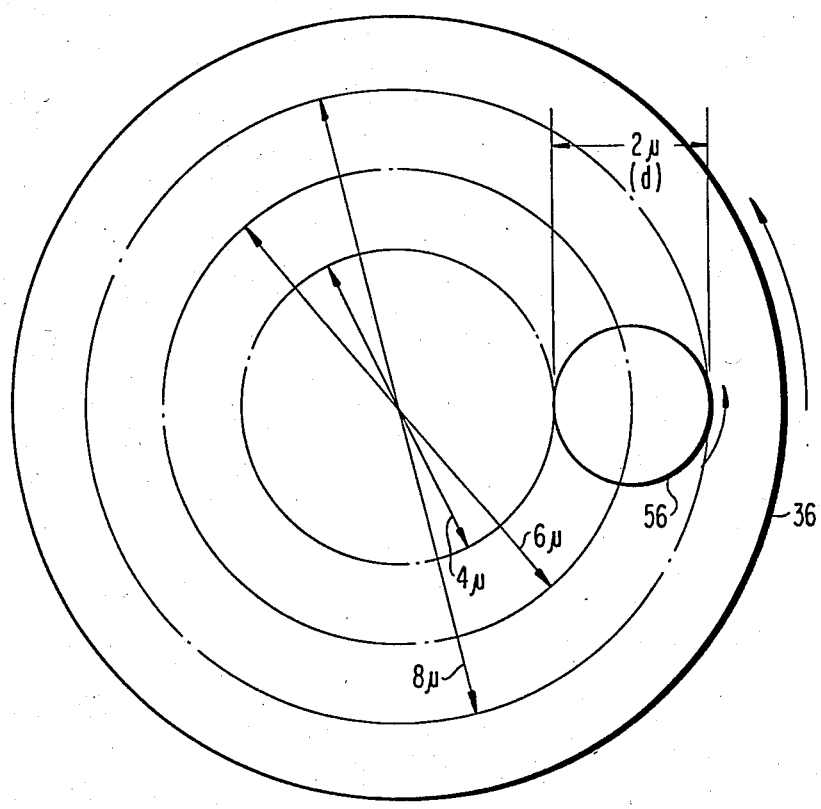
FIG. 7 is a schematic view showing diagrammatically the relative movement between the rod and cake or pool of the apparatus in accordance with the principles of the present invention.

When the rod 56 and cake 36 are rotated in the same direction and at the same rate of rotation, and the rod 56 is entirely offset from the axis of rotation of the cake 36, the geometric relationship between the rod and cake is such that the relative motion at the cake-rod interface is substantially uniform across the entire face of the rod. This unique feature of the present invention contributes to the production of dislocation or discontinuity-free crystals having uniform physical and chemical properties. Referring to FIG. 7, it will be readily seen that the translation past the rod 56 is substantially uniform under these conditions. Where $\mu$ is any unit of length, the translation of the rod 56 at its outer surface per revolution will be $\pi d$ or $2 \mu\pi$. The translation of the cake per revolution will be as follows:

(1) past center of rod—6 $\mu\pi$
(2) past outer edge of rod—8 $\mu\pi$
(3) past inner edge of rod—4 $\mu\pi$ Accordingly, the relative movement per revolution of the cake past the rod will be as follows:

(1) at center of rod—6 $\mu\pi$
(2) at outer edge of rod—8 $\mu\pi - 2 \mu\pi = 6 \mu\pi$
(3) at inner edge of rod—4 $\mu\pi + 2 \mu\pi = 6 \mu\pi$ It will be readily seen, therefore, that the relatively movement across the entire face of the rod is the same, namely, 6 $\mu\pi$ per revolution.

Preferably, one or more observation windows 111 are provided in the furnace enclosure 12, as shown in FIG. 1, positioned to enable visual inspection of the enterior thereof, and especially the rod melt interface region. The windows 111 may, for example, be sealingly secured in viewing ports 113 extending generally angularly outwardly of the cylinder 14. Gas inlet means 115 is also preferably provided at each viewing port 113 adjacent the window 111 thereof to keep the window clear from condensation or deposition materials volatized from the pool of molten material 50.

While the monocrystalline rod 56 preferably is pulled from an off-center location, as shown in FIGS. 1 and 2, it is within the scope of the present invention to pull the rod of monocrystalline material from the center of the melt, as in conventional Czochralski techniques, but without requiring the use of a crucible. For example, with reference now to FIG. 3 of the drawings, there is schematically shown and illustrated a cake of polycrystalline material 120 supported within a furnace enclosure 122. The cake 120 is mounted, for example, upon a quartz disk 124 structurally associated with a rotatable and advanceable support shaft 126. The shaft 126 is structurally associated with the furnace enclosure 122 as by means of a sealed bearing 128. Feed means, such as feed rollers 130 are provided for advancing the shaft 126 and the associated quartz disk 124 and cake 120. Heating means, such as a resistance heating element or radio-frequency induction heating element 132, is provided adjacent the upper surface of the cake 120 to maintain a portion 134 thereof in the molten state. The power input to the heating means 132 should be such that the molten portion 134 should not extend to the periphery of the cake 120 but should be contained by a solid peripheral portion 136 of the cake 120. A rod of monocrystalline material 138 may be drawn or pulled from the pool of liquid material or portion 134 in the same manner as such a rod would be pulled from a melt contained within a crucible according to Czochralski techniques.

As the rod of monocrystalline material 138 is drawn or pulled from the pool of liquid material or portion 134, the element or induction heating element 140 may be provided adjacent the rim portion 136 of the cake 120 to cause the rim or peripheral portion 136 to melt upon relative movement therebetween to preclude formation of a deep shell.

Figure 3:
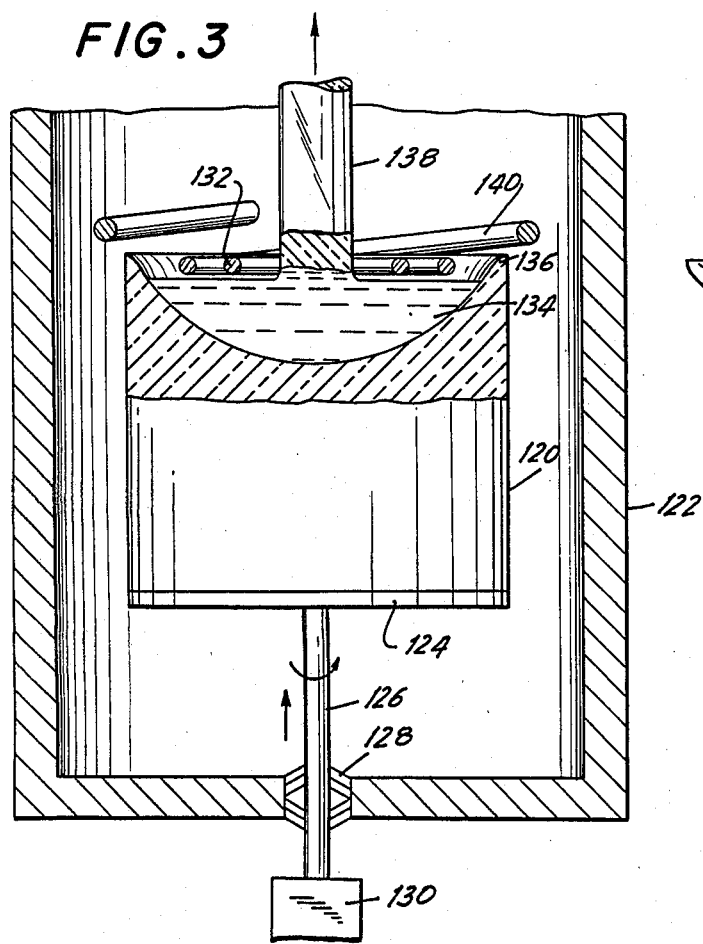
FIG. 3 is a partial cross-sectional elevational view of another embodiment of apparatus in accordance with the principles of the present invention.

All of the other features of the apparatus shown in FIG. 1, such as the cooling sleeve 104 or the chilled mold 110 may, of course, be provided with the apparatus of FIG. 3.

Figure 4:
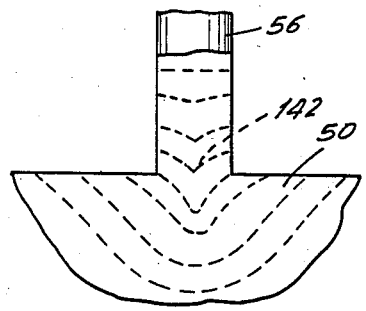
FIG. 4 is a partial cross-sectional elevational view schematically illustrating one form of temperature profile produced by prior apparatus.
Figure 5:
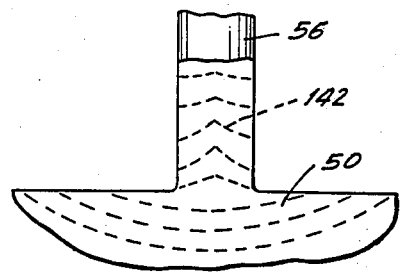
FIG. 5 is a view similar to FIG. 4 schematically illustrating another temperature profile produced in previous apparatus.
Figure 6:
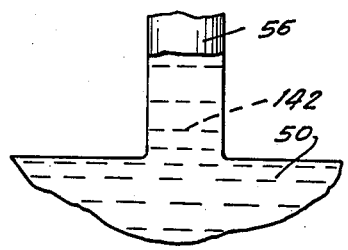
FIG. 6 is a view similar to FIGS. 4 and 5 schematically illustrating the ideal temperature profile produced by the present invention.

With reference now to FIGS. 4, 5 and 6 of the drawings, there is respectively shown and illustrated lines 142 which are indicative of the temperaure profile present across the rod, melt, and rod-melt interface under varying conditions. If the temperature profiles shown in FIGS. 4 and 5 are present, then the central portion of the crystal rod will be cooling more slowly or more rapidly than the exterior portions thereof, respectively. Such irregular cooling or solidifying of the crystal may result in a non-linear crystallization front and, accordingly, non-uniform transverse physical, chemical and electrical properties. In the present invention, when the rod 56 is grown from an off-center location, a better temperature profile is obtainable and a better crystallization front is attained, especially when the rod is properly cooled or heat balanced, which in the present invention may be controlled by the positioning of the cooling sleeve 104, the positioning of the supplementary heat control means 109, and the energy conditions thereof. The ideal temperature profile, as shown in FIG. 6, which will result in a minimum of crystal dislocation, may be accomplished by the present invention.

While the invention has been shown, illustrated, described and disclosed in terms of certain preferred embodiments or modifications which it has assumed in practice, the scope of the invention should not be deemed to be limited by the precise embodiments or modifications herein shown, illustrated, described or disclosed, such other embodiments or modifications as may be suggested to those having the benefit of the teachings herein being intended to be reserved especially as they fall within the scope and spirit of the claims hereto appended. Particularly, while the invention has been shown, described, illustrated and disclosed in terms of the production of monocrystalline rods, especially for use in the production of semi-conductor devices, it is to be particularly understood that the principles of the present invention are likewise suitable for the growing of other materials, whether monocrystalline, polycrystalline, amorphous, metals or the like.

What is claimed is:

1. Method of forming crystalline material into large diameter substantially mono-crystalline rods having a minimum of dislocations comprising, at least the steps of, rotating a substantially solid cake of crystalline material within a controlled atmosphere about a generally vertical central axis; heating at least a portion of the upper surface of such cake on at least one side of the rotational axis to a temperature just above the melting point of the material so that the heat and rotation provide a pool of molten material encircling the rotational axis supported and contained by the cake; slowly withdrawing a substantially mono-crystalline rod upwardly from the surface of said pool so that material from said pool may crystallize at the interface therebetween to elongate the crystal structure of the rod; and rotating the rod at substantially the same rotational velocity and in the same direction about a generally vertically disposed axis parallel to and off-center from the rotational axis of the cake so that the relative motion at the pool-rod interface is substantially uniform across the entire face of the rod and thermal asymmetrics are minimized.

2. Method defined in claim 1 further comprising heating the entire cake to a temperature just below the melting point thereof so that the temperaure throughout the pool will be substantially uniform.

3. Method defined in claim 1 further comprising cooling the rod at a uniform rate from a fixed location relative to the surface of the pool so that the temperature profile at the interface will be substantially flat and uniform to reduce the incidence of thermal stresses and crystal dislocations.

4. Method defined in claim 2 further comprising providing a uniform temperature condition to the rod at a fixed distance above the surface of the pool so that a uniform and controlled heat balance will be produced and the temperature profile at the rod-pool interface will be substantially uniform, flat and constant.

5. Method defined in claim 4 wherein said step of providing a uniform temperature condition comprises passing the rod through a cooling sleeve having a controlled reduced temperature for uniformly cooling the rod.

6. Method defined in claim 4, wherein said step of providing a uniform temperature condition comprises passing the rod through a heating sleeve having a controlled elevated temperature for uniformly heating the rod.

7. Method defined in claim 4 wherein said step of providing a uniform temperature condition comprises passing the rod through heating and cooling zones to control the growing profile across the rod at the rod-pool interface.

8. In a method of forming crystalline materials into substantially mono-crystalline rods wherein a pool of molten crystalline material is rotated about a generally vertical axis, and a substantially monocrystalline rod is withdrawn upwardly from the surface of the pool so that material from the pool crystallizes at the interface therebetween to elongate the crystal structure of the rod, the improvement comprises:

providing a controlled temperature zone at the interface between the pool and the rod; and
controlling the temperature of the controlled temperature zone so that as the rod is passed through the controlled temperaure zone, the horizontal cross sectional growing profile across the rod at the rod-pool interface is controlled to maintain a uniform temperature across said horizontal cross sectional growing profile.

9. Method defined in claim 8 wherein said monocrystalline rod is rotated.

10. In a method of forming crystalline materials into substantially monocrystalline rods wherein said rod is withdrawn from a molten pool so that the material from the pool crystallizes at the interface therebetween to elongate the crystal structure of the rod, the improvement comprises:

providing a controlled temperature zone at the interface between the pool and the rod; and
controlling the temperature of the controlled temperature zone so that as the rod is passed through the controlled temperature zone at a fixed distance from the pool, the temperature profile horizontally across the cross-section of the rod at the rod-pool interface is uniformly controlled to maintain a uniform temperature across said horizontal cross section of the rod.

11. Method defined in claim 10 wherein dynamic heat flow in the rod is controlled from the pool-rod interface to a distance beyond which there is no further effect on the growth at the interface.

12. Method defined in claim 10 wherein controlled temperature condition comprises at least one heat exchange zone.

13. Method defined in claim 10 wherein temperature profile across rod is flat.

14. Method defined in claim 1 including a vessel containing the pool of molten material and further comprising disposing a chilled mold below the vessel containing the pool to catch any material that will fall thereon without contamination of the material.

15. Method defined in claim 14 wherein said chilled mold is contoured so that solidification of material cannot damage said mold by expansion or contraction of material.

16. Method of forming crystalline material into large diameter substantially mono-crystalline rods having a minimum of dislocations comprising, at least the steps of, rotating a substantially solid cake or crystalline material within a controlled atmosphere about a generally vertical central axis; heating such cake to maintain the temperature thereof just below the melting point of the materia; heating at least a portion of the upper surface of such cake on at least one side of the rotational axis to a temperature just above the melting point of the material so that the heat and rotation provide a pool of molten material having a generally uniform temperature supported and contained by the cake; slowly withdrawing a substantially monocrystalline rod upwardly from the surface of said pool so that material from said pool may crystallize at the interface therebetween to elongate the crystal structure of the rod; and providing a uniform and controlled temperature zone to the rod at a fixed distance from the surface of the pool so that a flat and uniform temperaure will exist horizontally across the cross section of the interface.

17. Method defined in claim 16 wherein said step of providing a uniform temperature condition comprises passing the rod through a cooling sleeve having a controlled reduced temperature for uniformly cooling the rod.

18. Method defined in claim 16 wherein said step of providing a uniform temperature condition comprises passing the rod through a heating sleeve having a controlled elevated temperature for uniformly heating the rod.

* * * * *